(12) United States Patent
Calvin et al.

(10) Patent No.: US 7,801,206 B2
(45) Date of Patent: Sep. 21, 2010

(54) ENCODED SERIAL DATA BIT ERROR DETECTOR

(75) Inventors: John C. Calvin, Portland, OR (US); Michael J. Wadzita, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 1021 days.

(21) Appl. No.: 11/415,800

(22) Filed: May 1, 2006

(65) Prior Publication Data

US 2006/0245484 A1     Nov. 2, 2006

(51) Int. Cl.
    *H04B 3/46*     (2006.01)
    *H04B 17/00*     (2006.01)
    *H04Q 1/20*     (2006.01)

(52) U.S. Cl. .................. 375/228; 375/224; 375/225; 375/227; 714/724

(58) Field of Classification Search .................. 375/228, 375/224, 225, 227; 714/724
See application file for complete search history.

(56) References Cited

U.S. PATENT DOCUMENTS 6,977,599 B2    12/2005    Widmer
7,403,560 B2 *    7/2008    Gamper et al. .............. 375/228
7,475,304 B1 *    1/2009    Kaufman et al. ............ 714/724

* cited by examiner

*Primary Examiner*—Phuong Phu
(74) *Attorney, Agent, or Firm*—Francis I. Gray; Thomas F. Lenihan

(57) ABSTRACT

An encoded serial data bit error analyzer captures the actual waveform of an encoded serial data stream associated with a bit error so that a user may readily validate the cause of the bit error. An encoded serial data stream decoder in the analyzer is modified to provide a signal for a trigger system when a characteristic of a bit error failure is detected. A power splitter produces a pair of incident encoded serial data streams from a programmable test signal, one of which is input to a device under test and the other is input to the analyzer. A re-transmitted encoded serial data stream from the device under test is input to another channel of the analyzer. The encoded serial data stream decoder provides an "error detected" output when a condition occurs in the re-transmitted encoded serial data stream indicative of a bit error. The "error detected" output is used as a trigger signal to capture the incident and re-transmitted encoded serial data waveforms surrounding the detected bit error.

2 Claims, 8 Drawing Sheets

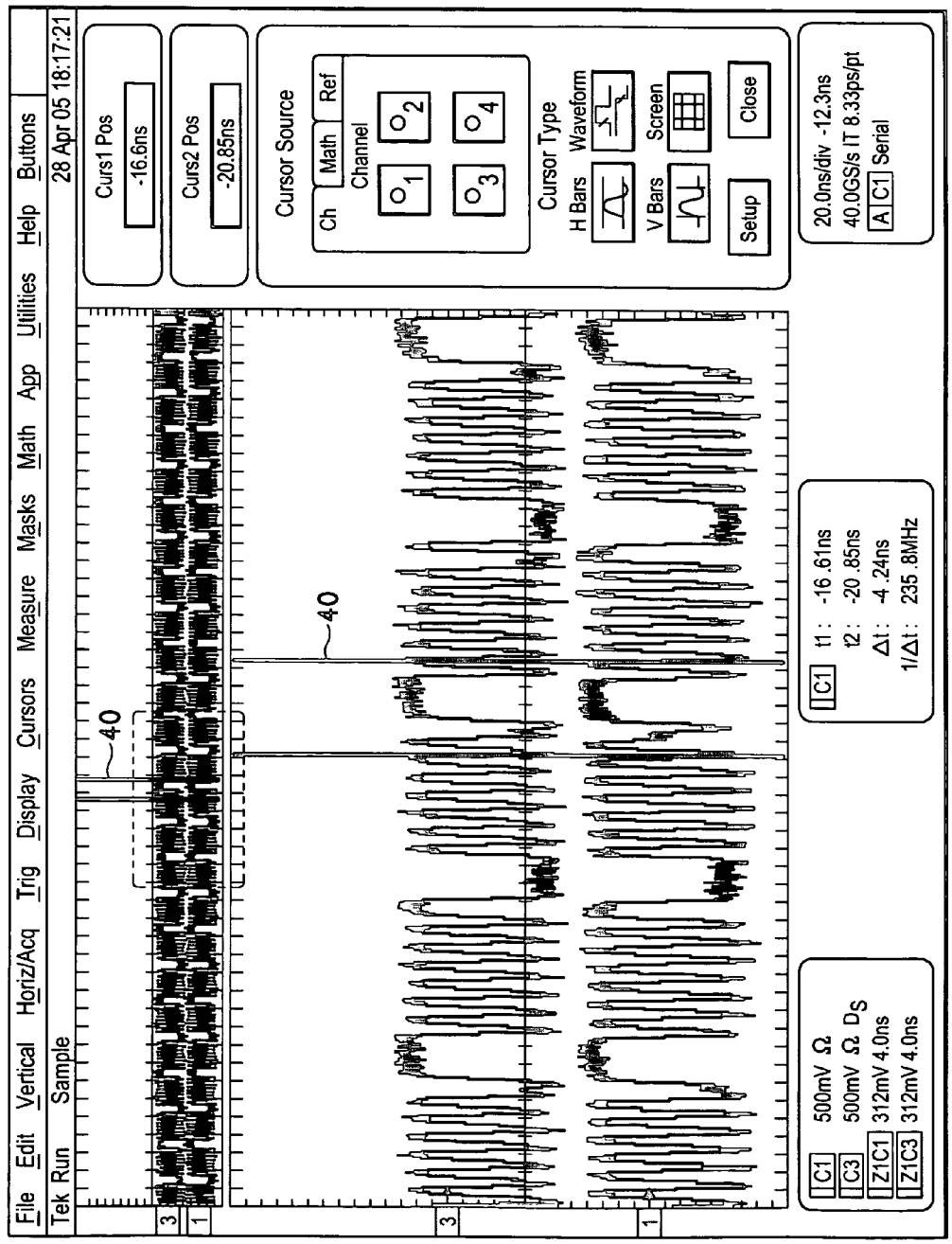

US 7,801,206 B2

ENCODED SERIAL DATA BIT ERROR DETECTOR

BACKGROUND OF THE INVENTION

The present invention relates to bit error detection, and more particularly to the capturing of analog waveforms representing digital data within which bit errors are detected.

In modern digital systems data are transmitted between devices over serial data interfaces using a high speed encoding/decoding protocol, such as the 8B/10B encoding/decoding protocol described in U.S. Pat. No. 6,977,599 issued to International Business Machines Corporation. In this encoding/decoding protocol, which has become essentially an industry standard, 8-bit data bytes are encoded into 10-bit Transmission Characters to improve the physical signal. The 10-bit Transmission Characters are then converted into a serial bit stream for transmission over a high speed serial bus. At the receiving device the serial bit stream is converted back to the 10-bit Transmission Characters which are then decoded to recover the original 8-bit data bytes.

Option PTD for the Tektronix TDS6000C digital oscilloscopes provides trigger and decoding features for greater insight when analyzing 8B/10B encoded serial data streams. This option enables users to simultaneously view waveform, character and protocol activity, simplifying validation of link-level communications and isolation of data-dependent faults. It provides direct hardware-based triggering on 8B/10B character sequences, i.e., pattern matching. The 8B/10B encoded serial data stream is converted to 10-bit Transmission Characters, decoded into 8-bit bytes and matched with a desired 8-bit pattern or character to generate the trigger signal for capturing the waveform of the 8B/10B serial data stream.

One of the characteristics that is specified for high speed digital equipment is called bit error rate (BER). The specification for BER typically equates to one bit error per hour. Due to degradation of the serial bit stream over transmission media or other processing, amplitude variations and jitter introduced into the serial bit stream may cause a bit state to be interpreted incorrectly by a receiving device, resulting in a bit error. Currently serial data stream transmitters are tested using bit error rate testers (BERTs). BERTs provide a known data pattern to the transmitter at an input and then compares the serial data output from the transmitter with the pattern at the input in a logical OR operation. If there are any bit errors resulting from the comparison, a bit error counter is incremented. After a specified period of time the BER for the device is computed from the bit error counter value.

The technical challenge is in testing a data receiver, as there is no observability as to what the receiver is doing. The receiver converts the serial data stream back to the 8-bit bytes. In order to test the receiver, the receiver is placed in a loop-back mode where the 8-bit bytes are encoded and serialized to provide a re-transmitted serial data stream. When using a BERT to test the receiver, there is generally a discrepancy between the high precision BERT clock that generates the test data stream and the clock in the receiver that creates the re-transmitted data stream. This results in false bit errors recorded by the BERT when the clocks get sufficiently out of sync. Most receivers now use a mechanism called a re-timed loopback where at timed intervals a special string of bits that still comply with the encoding/decoding protocol are inserted into the re-transmitted data stream. Since these insertions are not in the original pattern sent from the BERT, the BERT records a series of bit errors that are erroneous. Attempts to compensate for this inserted data string result in very expensive BERTs, which are relatively expensive to begin with.

In any event the BER determined by a BERT does not give the user confidence that the counted bit errors are valid when testing a receiver. There is nothing currently available that provides the ability to capture the actual waveform when a bit error occurs so that a user may have a physical layer view of the serial data stream in the vicinity of the bit error to see the cause of the bit error detection.

BRIEF SUMMARY OF THE INVENTION

Accordingly the present provides an encoded serial data bit error analyzer for capturing the actual waveform of an encoded serial data stream associated with a bit error so that a user may readily validate the cause of the bit error. An encoded serial data stream decoder is modified to provide a signal for a trigger system when a characteristic of a bit error failure is detected. A programmable signal source provides a test encoded serial data stream having known amplitude/jitter characteristics to a power splitter situated adjacent to a device under test. The power splitter produces a pair of incident encoded serial data streams, one of which is input to a device under test and the other is input to one channel of the analyzer. A re-transmitted encoded serial data stream from the device under test is input to another channel of the analyzer. An "error detected" output from the encoded serial data stream decoder is used as a trigger signal by the analyzer to capture the incident and re-transmitted encoded serial data streams surrounding the detected bit error, which data streams are presented as an analog waveform display so that a user is assured that the bit error detected is valid.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 8 is a plan view of another waveform display according to the present invention.

DETAILED DESCRIPTION OF THE INVENTION

Figure 1:
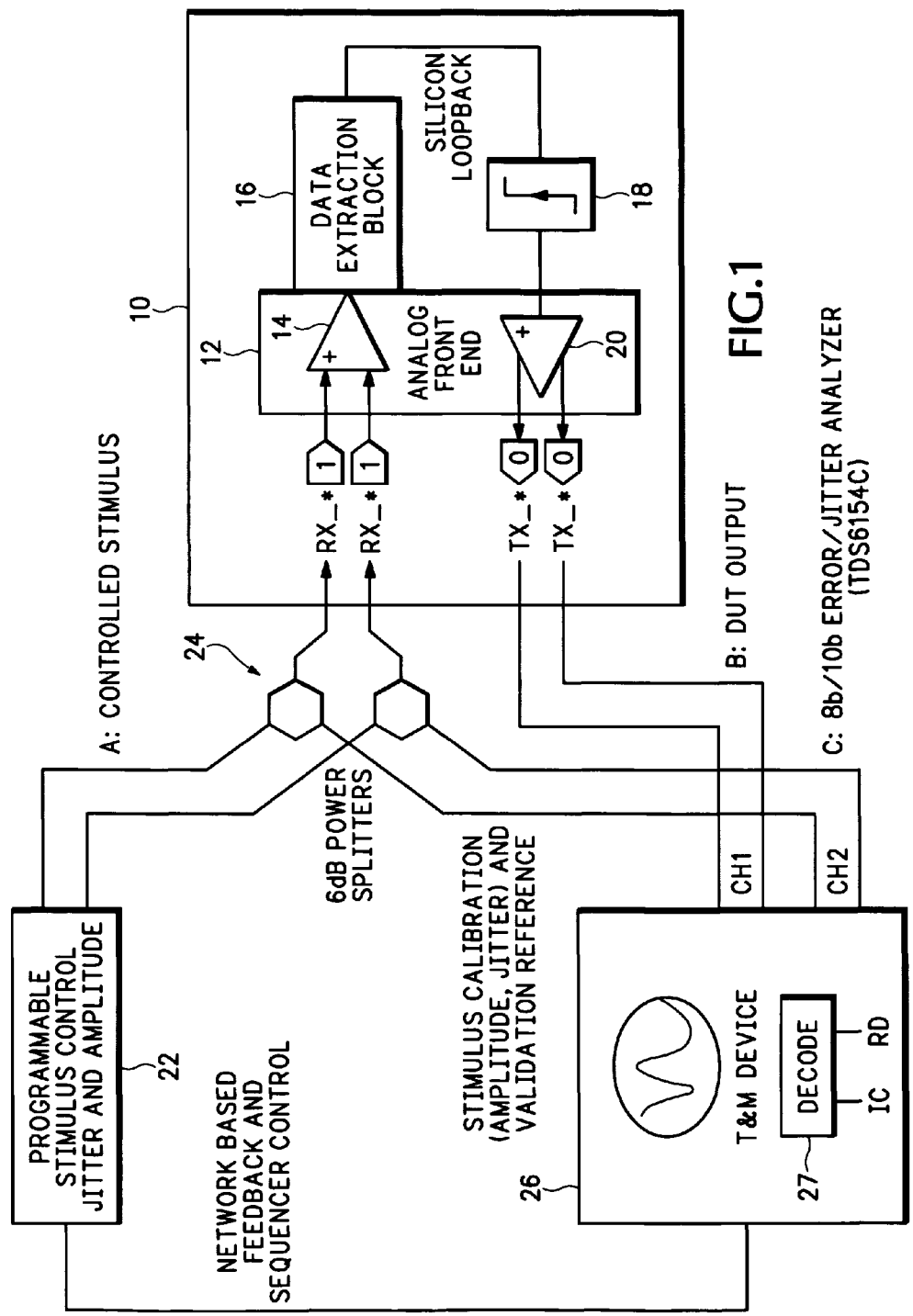
FIG. 1 is a block diagram view of a system for detecting a bit error and capturing the associated waveform for an encoded serial data stream according to the present invention.

Referring now to FIG. 1 a device under test (DUT) 10 is shown in a loopback mode. The DUT 10 has an analog front end 12 for receiving an encoded serial data stream at an input amplifier 14. The output from the input amplifier 14 is input to a data extraction circuit 16 to recover the original characters represented by the encoded serial data stream in a conventional manner. The original characters are looped back to a converter 18 to re-generate the encoded serial data stream. The re-generated encoded serial data stream is then re-transmitted via an output amplifier 20 in the analog front end 12. A programmable signal source 22, such as the Tektronix AWG710 Arbitrary Waveform Generator manufactured by Tektronix, Inc. of Beaverton, Oreg., provides the encoded serial data stream for input to the DUT 10. The programmable signal source 22 controls both amplitude and jitter for the encoded serial data stream. As shown the encoded serial data stream is in a differential format and is input to a power splitter 24 that is physically located as close as possible to the analog front end 12 of the DUT 10 so that any bit errors that occur in the re-transmitted encoded serial data stream are caused by the DUT 10, and not by the transmission media. A portion of the encoded serial data stream is input to the input amplifier 14, and another portion is input to one channel of a test and measurement device 26, such as a Tektronix TDS600C digital oscilloscope with option PTD, that includes an encoded serial data stream decoder 27 so that a trigger system may trigger on a specified pattern within the encoded serial data stream as described above. Input to a second channel of the test and measurement device 26 is the re-transmitted encoded serial data stream from the DUT 10.

The decoder 27 in option PTD is modified to provide three additional pieces of information from the encoded serial data stream. The significant pieces of information for the present invention are an illegal character (IC) signal line and a running disparity (RD) signal line, as it is presumed that the re-transmitted encoded serial data stream generates one of these two errors in the event of a bit failure or error in the data stream. Any single bit failure or bit error generates one of these errors, so both are triggerable events. An illegal character occurs when a decoded word from the encoded serial data stream doesn't match any valid word within the encode/decode protocol. For the 8B/10B protocol each valid 10-bit Transmission Character should correlate to a corresponding 8-bit data word in a look-up table. If there is no match, then the illegal character line is set. The setting of the illegal character line is used as a trigger signal to capture both the incident and the re-transmitted encoded serial data streams for analysis. A running disparity occurs when there are the number of "bits" for a first logic level are greater than the number of bits for a second logic level, i.e., there is generally an equal number of "1"s and "0"s in the encoded serial data stream for any given time period. If there is a running disparity detected, then the running disparity line is set and also used as a trigger signal to capture both the incident and the re-transmitted encoded serial data stream for analysis.

Figure 2:
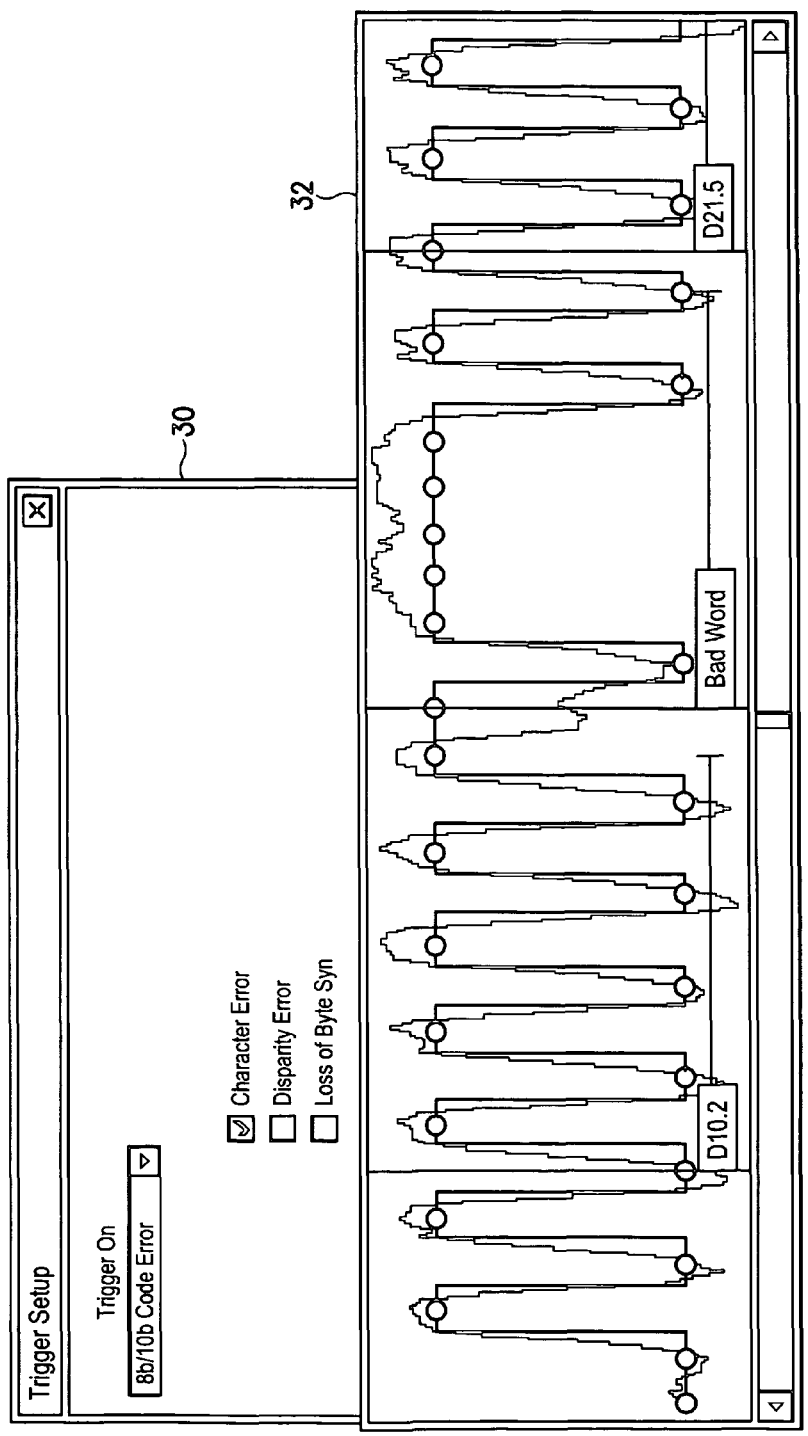
FIG. 2 is a plan view of a trigger setup window and associated waveform according to the present invention.

Referring now to FIG. 2 a portion of a trigger setup window 30 is shown that indicates the trigger is "on" and is set to detect an 8B/10B Code Error, specifically a Character Error. A representative waveform 32 is shown that shows a portion of the encoded serial data stream captured as a result of an illegal character. The illegal character in this instance is shown as a signal that is stuck at one logic level for a period of time instead of having alternating logic levels.

Figure 3:
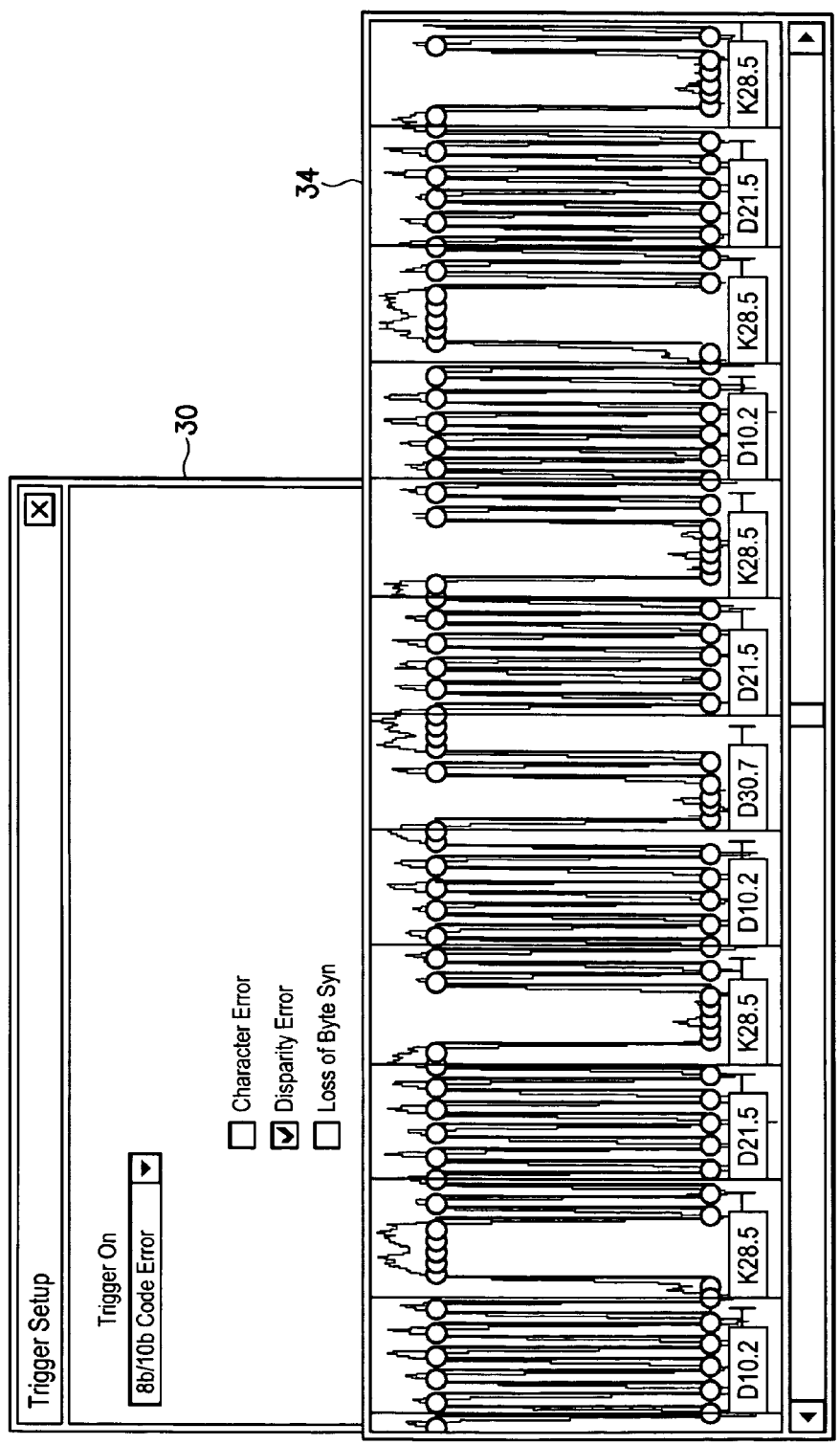
FIG. 3 is a plan view of another trigger setup window and associated waveform according to the present invention.

FIG. 3 shows the portion of the trigger setup window 30 with a Disparity Error selected as the 8B/10B Code Error to trigger on. A representative waveform 34 is shown that has periods where the signal is stuck at one or another of the logic levels, resulting in a corresponding charge building up on the data line to cause the running disparity error. The user can readily see from this captured waveform where the running disparity errors occurred.

By monitoring a trigger/acquisition counter that counts each trigger event, the number of bit errors may be tracked over some controlled monitoring interval to determine a BER as well. By monitoring via the power splitter 24 both the incident and the looped back re-transmitted encoded serial data streams, a user is assured that the BER is accurate, i.e., validates that the bit errors in the re-transmitted encoded serial data stream represent legitimate bit failures on the part of the DUT 10 and are not due to the programmable signal source 22 or cabling. By carefully controlling the amplitude and jitter of the programmable signal source 22, a bit error bathtub curve may be profiled for the DUT 10 by driving it to amplitude and jitter levels that induce hard and repetitive failures, and then slowly refining the source signal to be cleaner and cleaner to the point where the DUT 10 is re-transmitting data error free. The bathtub curve is profiled by capturing the DUT 10 rate of failure at each level of amplitude/jitter aberration.

A typical DUT test may be performed as follows. The programmable signal source 22 is programmed to instruct the DUT 10 to initiate a far end retimed loopback mode. The test signal levels from the programmable signal source 22 are set to a minimum amplitude and jitter generation is set to some nominal $R_j$ and $D_j$ levels ten percent (10%) under a specification limit for the DUT 10. The test signal source is split via the power splitter 24, with one 6 dB reduced output being input to the DUT 10 and the other output being input to the 8B/10B error detectors in the second channel of the test and measurement instrument 26. This is used for initial setup validation and constant monitoring to ensure proper signal levels and jitter have been synthesized by the programmable signal source 22. Upon detecting either an illegal character or running disparity error at the detector, indicating a bit failure, the test and measurement instrument 26 captures both channels. This is used to validate that the bit error was induced by the programmable signal source 22 and to confirm that the incident data is indeed within specifications. If this criteria is confirmed to be within nominal limits, then the bit error is a legitimate DUT failure and is counted. The error detector in the first channel is used to sense bit failures in the re-transmitted encoded serial data stream. This test is run for an appropriate amount of time to satisfy an appropriate population criteria, such as that outlined in the SATA specification, section 6.4.1.4.2.

Figure 4:
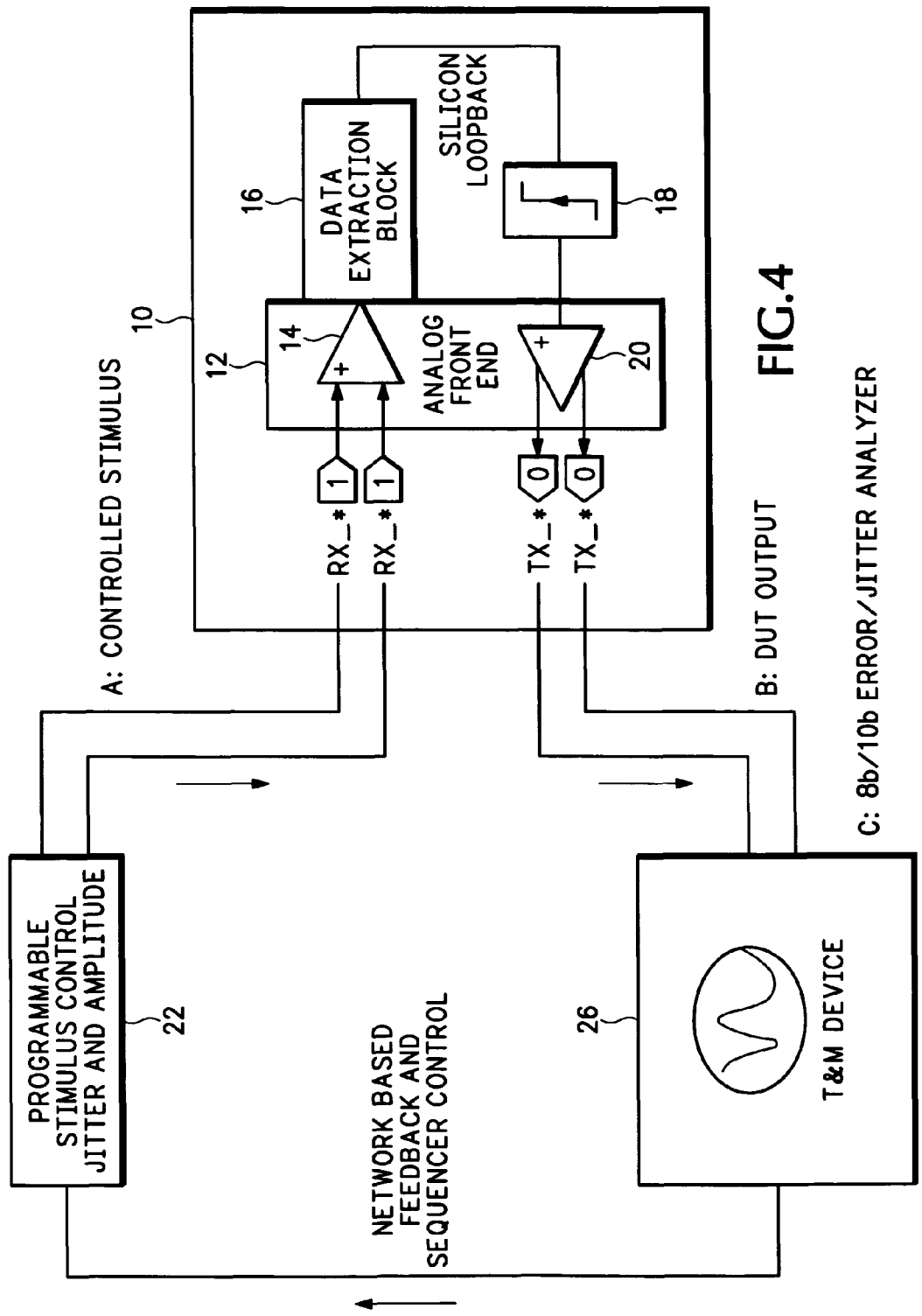
FIG. 4 is a block diagram view of an alternative system for detecting a bit error and capturing the associated waveform according to the present invention.
Figure 5:
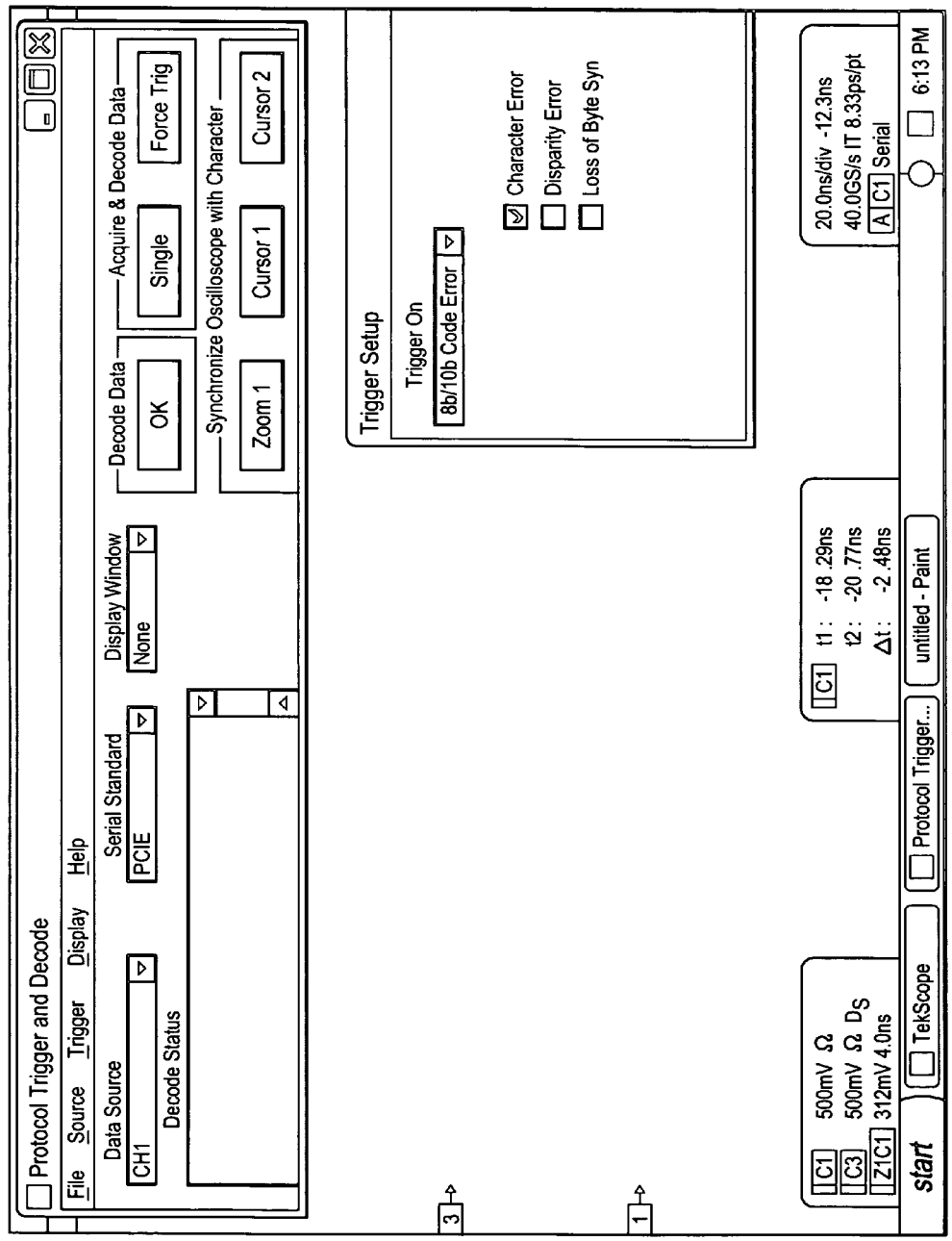
FIG. 5 is an expanded plan view of the trigger setup window of FIG. 2 according to the present invention.
Figure 6:
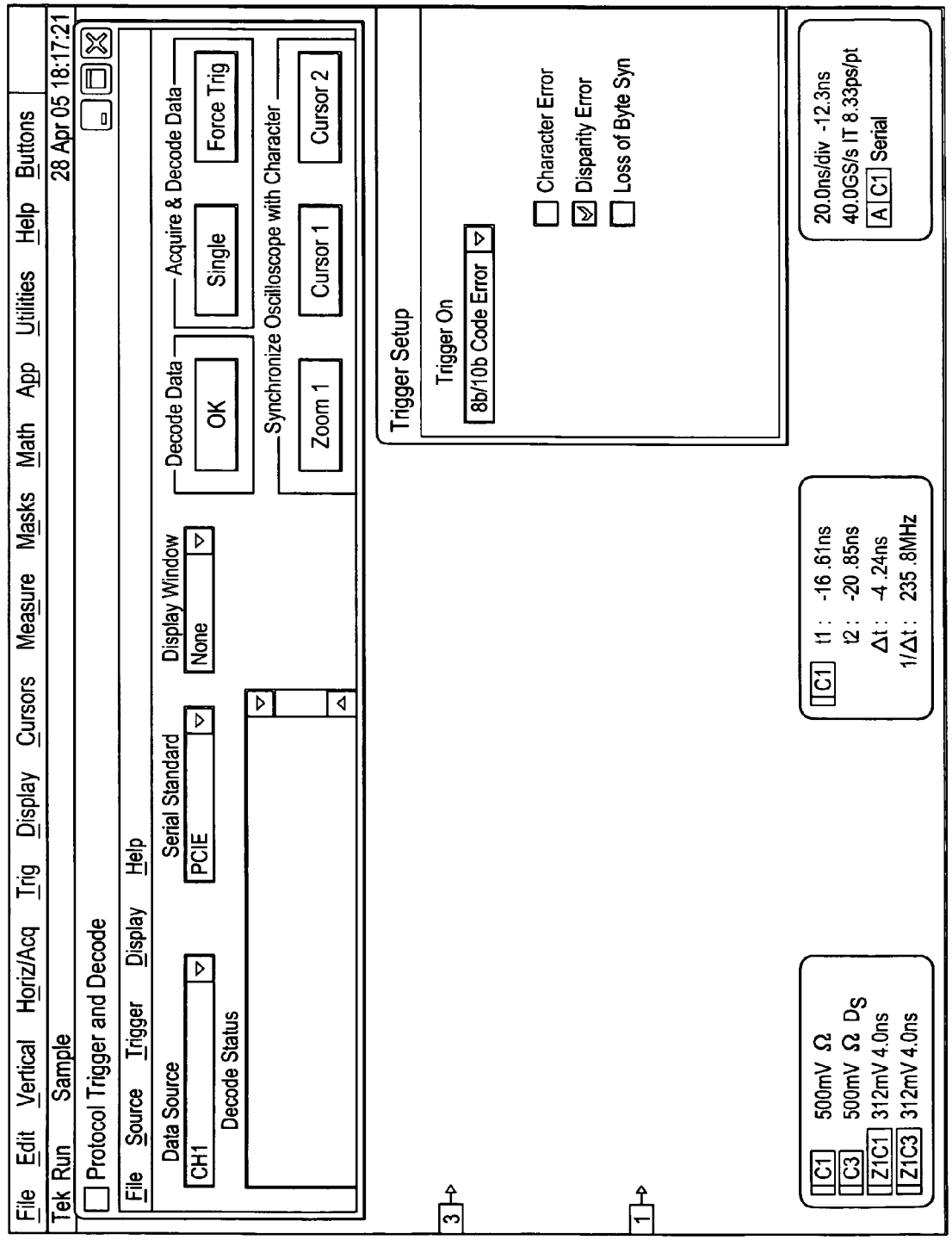
FIG. 6 is an expanded plan view of the trigger setup window of FIG. 3 according to the present invention.
Figure 7:
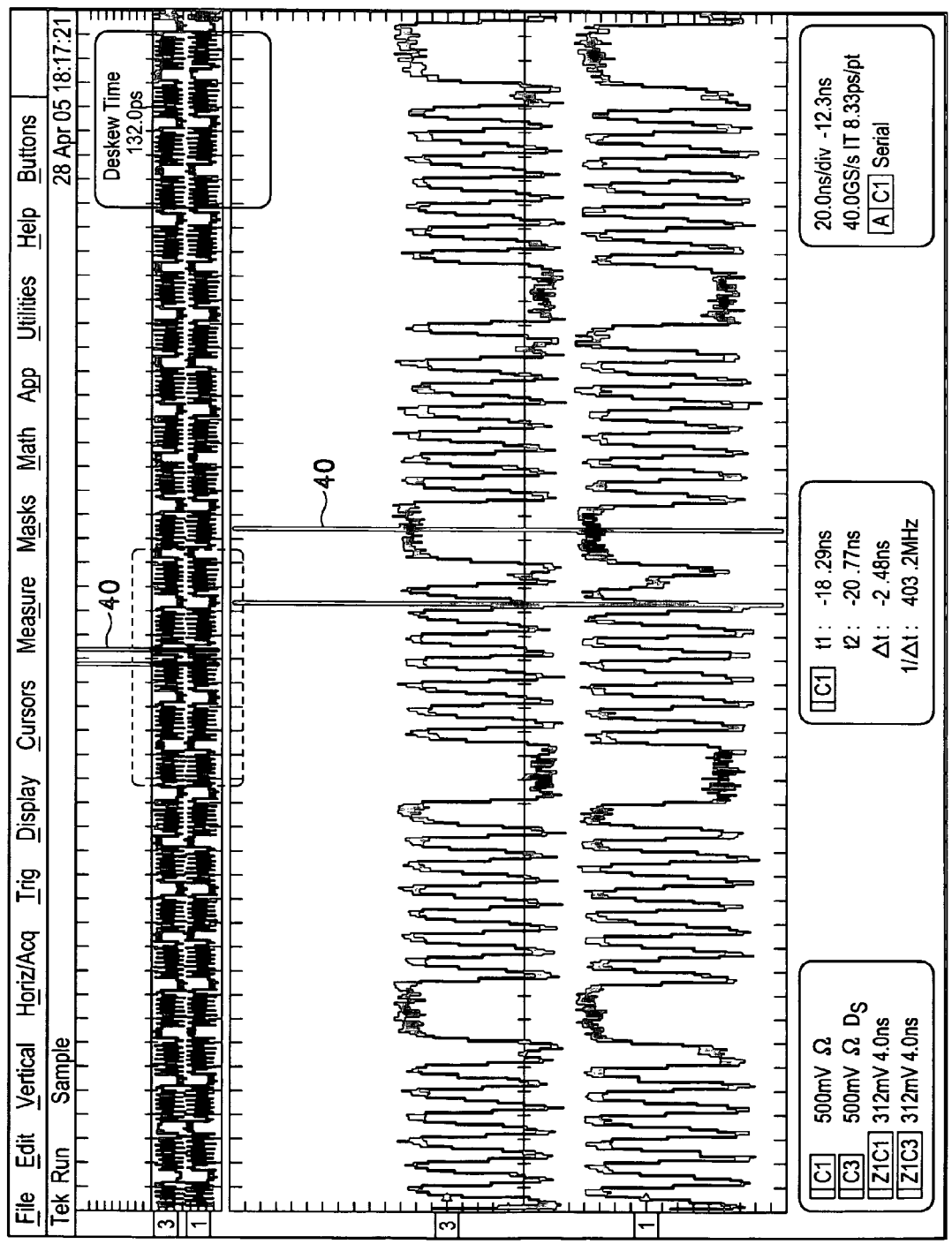
FIG. 7 is a plan view of a waveform display showing captured data about a detected bit error according to the present invention.

FIG. 4 shows a typical test bench setup for SATA testing according to three different use cases: transmitter test non-loopback mode, transmitter test loopback mode and receiver test loopback mode. The screenshots of FIGS. 5-8 demonstrate the ability to perform these "trigger on bit failure" features on a Tektronix TDS6154C digital oscilloscope. The screenshots of FIGS. 5-6 show screens of the TDSPTD utility, while the screenshots of FIGS. 7-8 show two scope waveforms that demonstrate triggering on a bit error which has manifested itself as a illegal character or a running disparity error. A Curser 40 is bracketing the failure area. The top waveform represents the entire acquisition data record for the re-generated waveform, while the middle waveform is the incident clean data and the bottom waveform is the loopback data which is carrying the defect.

Thus the present invention provides an encoded serial data bit error detector that captures incident and re-transmitted encoded serial data waveforms associated with detected bit errors to provide validation of the bit errors to a user.

What is claimed is:
1. An encoded serial data bit error analyzer system comprising:
 a programmable signal source for generating a test encoded serial data stream having known amplitude/jitter characteristics;

a power splitter situated adjacent a device under test to which the test encoded serial data stream is input to provide as outputs a pair of incident encoded serial data streams, one of which is input to the device under test;

a test and measurement device having as inputs the other one of the pair of incident encoded serial data streams and a re-transmitted encoded serial data stream from the device under test, the test and measurement device having a bit error detector to provide a trigger signal when a condition in the re-transmitted encoded serial data stream occurs representative of a bit error so that the incident and re-transmitted encoded serial data streams are captured for display as analog waveforms that include the bit error.

2. An improved test and measurement device of the type having an encoded serial data stream decoder and a trigger generator for matching a specified pattern with an input encoded serial data stream to capture an encoded serial data stream waveform when the specified pattern corresponds to a pattern decoded from the input encoded serial data stream waveform by the encoded serial data stream decoder, wherein the improvement comprises a bit error detector incorporated within the encoded serial data stream decoder that receives the input encoded serial data stream waveform and an original encoded serial data stream waveform corresponding to the input encoded serial data stream waveform to provide a trigger signal when a condition in the input encoded serial data stream waveform occurs indicative of a bit error, so that the input encoded serial data stream waveform and the original encoded serial data stream waveform associated with the bit error are captured.

* * * * *